US011601018B2

United States Patent
Liu et al.

(10) Patent No.: US 11,601,018 B2
(45) Date of Patent: Mar. 7, 2023

(54) CONTROL SYSTEM FOR WIRELESS POWER TRANSFER SYSTEM

(71) Applicant: ZHEJIANG UNIVERSITY, Hangzhou (CN)

(72) Inventors: Zhitao Liu, Hangzhou (CN); Jia Liu, Hangzhou (CN); Hongye Su, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 17/778,829

(22) PCT Filed: Jun. 22, 2021

(86) PCT No.: PCT/CN2021/101426
§ 371 (c)(1),
(2) Date: May 20, 2022

(87) PCT Pub. No.: WO2022/052559
PCT Pub. Date: Mar. 17, 2022

(65) Prior Publication Data
US 2022/0416584 A1 Dec. 29, 2022

(30) Foreign Application Priority Data

Sep. 11, 2020 (CN) .......................... 202010953179.8
Sep. 11, 2020 (CN) .......................... 202010954238.3

(51) Int. Cl.
*B60L 53/62* (2019.01)
*H02J 50/12* (2016.01)
(Continued)

(52) U.S. Cl.
CPC ............ *H02J 50/12* (2016.02); *B60L 53/122* (2019.02); *B60L 53/22* (2019.02); *B60L 53/62* (2019.02);
(Continued)

(58) Field of Classification Search
CPC ....................................................... B60L 53/62
See application file for complete search history.

(56) References Cited

U.S. PATENT DOCUMENTS

| 5,568,044 A * | 10/1996 | Bittner | H02M 3/1588 |
| | | | 323/224 |
| 2013/0166232 A1* | 6/2013 | Lee | H02J 13/00002 |
| | | | 702/62 |
| 2018/0026471 A1* | 1/2018 | Lu | H02J 7/00304 |
| | | | 320/134 |

FOREIGN PATENT DOCUMENTS

| CN | 106965689 A | 7/2017 |
| CN | 108282035 A | 7/2018 |

(Continued)

OTHER PUBLICATIONS

Jia Liu, et al., An Optimized Coil Array and Passivity-Based Control for Receiving Side Multilevel Connected DC-DC Converter of Dynamic Wireless Charging, IEEE Transactions on Vehicular Technology, 2022, pp. 3715-3726, vol. 71, No. 4.

*Primary Examiner* — Adi Amrany
(74) *Attorney, Agent, or Firm* — Bayramoglu Law Offices LLC

(57) ABSTRACT

A control system for a wireless power transfer (WPT) system includes current sampling modules, voltage sampling modules, a logic conversion circuit, and a controller area network (CAN) communication module that are all connected to a microprocessor module; the current sampling module is connected to the logic conversion circuit through a signal isolation circuit, the logic conversion circuit is connected to a pulse-width modulation (PWM) module, the PWM module is connected to an inverter circuit or a DC/DC converter, and the current sampling module and the voltage sampling module are connected to a primary side or a secondary side of the WPT system; transmitter coils on the
(Continued)

primary side are spaced apart on the road, a receiver coil on the secondary side is disposed on a chassis of an electric vehicle, and the transmitter coil includes a double rectangular coil, a ferrite core surface, and a shielding aluminum plate.

10 Claims, 7 Drawing Sheets

(51) Int. Cl.
*H02J 50/40* (2016.01)
*H02J 50/60* (2016.01)
*H02J 50/00* (2016.01)
*B60L 53/22* (2019.01)
*G01R 15/20* (2006.01)
*B60L 53/122* (2019.01)
*H02J 50/10* (2016.01)

(52) U.S. Cl.
CPC .......... *G01R 15/202* (2013.01); *H02J 50/005* (2020.01); *H02J 50/10* (2016.02); *H02J 50/40* (2016.02); *H02J 50/60* (2016.02); *B60L 2210/10* (2013.01); *H02J 2207/20* (2020.01)

(56) References Cited

FOREIGN PATENT DOCUMENTS

| | | |
|---|---|---|
| CN | 108767956 A | 11/2018 |
| CN | 208324952 U | 1/2019 |
| CN | 208459500 U | 2/2019 |
| CN | 209675988 U | 11/2019 |
| CN | 110581609 A | 12/2019 |
| CN | 211266555 U | 8/2020 |
| CN | 112092652 A | 12/2020 |
| CN | 112104109 A | 12/2020 |
| JP | 2020080602 A | 5/2020 |

* cited by examiner

CONTROL SYSTEM FOR WIRELESS POWER TRANSFER SYSTEM

CROSS REFERENCE TO TILE RELATED APPLICATIONS

This application is the national phase entry of International Application No. PCPCN2021/101426, filed on Jun. 22, 2021, which is based upon and claims priority to Chinese Patent Application No. 202010953179.8, filed on Sep. 11, 2020, and Chinese Patent Application No. 202010954238.3, filed on Sep. 11, 2020, the entire contents of which are incorporated herein by reference.

TECHNICAL FIELD

The present disclosure relates to a control system for a wireless power transfer (WPT) system in the field of power detection and control, and in particular, to a control system for a WPT system.

BACKGROUND

In recent years, the WPT technology for electric vehicles has received growing attention. A wireless charging system does not contain exposed ports, requires no manual operation, does not occupy ground space, and supports charging in static and traveling states. Therefore, compared with wired charging, the wireless charging mode has the advantages of safe operation, intelligent charging, flexible configuration, and is expected to reduce the battery pack size and vehicle mass of electric vehicles and reduce energy consumption.

However, the WPT system has a complex topology. In the application, a controller needs to provide high-frequency pulse-width modulation (PWM) signals for the WPT system, and drive an inverter circuit to generate high-frequency alternating current (AC) voltages. Meanwhile, corresponding voltage and current signals need to be collected. Each set of voltage and current sampling circuits performs step-down and current limiting on the voltage and current signals through a plurality of resistors, performs filtering through capacitors, and then outputs an analog voltage signal into a signal input terminal of a microprocessor module. The microprocessor module then processes the input signal, and uploads it to a host computer through a controller area network (CAN) communication module to display voltage and current values on a display interface. Then a user can check the voltage and current data and obtain corresponding system operation data.

In the existing control system, a step-down resistor and a capacitor are directly used to sample a power supply, and a resistance sampling signal is likely to be interfered with by high-frequency noise in a main circuit, which may lead to low sampling accuracy and affect correctness of subsequent data detection. Moreover, a software-based protection mechanism is used in the system, which has a problem of untimely protection and cannot ensure stable operation of the system.

In addition, the existing wireless charging technology can be classified into "rail type" and "segmented type". The "rail type" layout ensures stable power transmission for an electric vehicle within a range of rails. However, centrally supplying power to coils within the rail range increases system losses and causes severe electromagnetic leakage. In a "segmented type" layout, transmitter coils are arranged at intervals in the vehicle driving direction. A separate power supply method is adopted to supply power only to the coils directly below the vehicle body during normal operation. Such segmented power supply method can reduce system losses and effectively reduce electromagnetic leakage. However, a coupling coefficient between the transmitter and receiver coils changes rapidly in a wide range, greatly reducing transmission power and efficiency of the system. The wide-range change of the coupling coefficient also leads to huge fluctuations in the transmission power of the system, reducing reliability of the system.

SUMMARY

In order to resolve the problems existing in the background art, the present disclosure aims to provide a control system for a WPT system. The present disclosure uses a mutual inductor and a Hall effect sensor to collect voltage and current signals respectively, thereby achieving electric isolation of strong and weak currents. A hardware/software double protection mechanism is established to turn off PWM signals when the system voltage and current exceed preset thresholds, thereby effectively protecting the WPT system. In addition, a magnetic coupling system. for segmented dynamic wireless charging composed of transmitter and receiver coils can implement efficient power transfer, reduce coupling coefficient fluctuations and obtain stable output power during the dynamic wireless charging process.

The present disclosure adopts the following technical solutions:

The control system includes a circuit board, and a microprocessor module, two sets of current sampling modules, two sets of voltage sampling modules, a CAN communication module, and a PWM module that are disposed on the circuit board. The two sets of current sampling modules, the two sets of voltage sampling modules, a logic conversion circuit, and the CAN communication module are all connected to the microprocessor module through circuit board wiring; the two sets of current sampling modules are connected to the logic conversion circuit through their respective signal isolation circuits, the logic conversion circuit is connected to the PWM module, the PWM module is connected to an inverter circuit or a DC/DC converter, and the current sampling modules and the voltage sampling modules are connected to a primary side or a secondary side of the WPT system.

The WPT system includes the primary side and the secondary side. The primary side includes a transmitter coil, a primary-side resonant circuit, the inverter circuit, a rectifier circuit, and a power grid that are sequentially connected, and the secondary side includes a receiver coil, a secondary-side resonant circuit, a rectifier circuit, the DC/DC converter, and a battery that are sequentially connected.

The primary side and the secondary side of the WPT system are each provided with a controller circuit, the current sampling module and the voltage sampling module in the controller circuit on the primary side are connected to the inverter circuit, and the current sampling module and the voltage sampling module in the controller circuit on the secondary side are connected to the DC/DC converter.

The controller circuit further includes a switch mode power supply module, where the switch mode power supply module supplies working power of corresponding voltage levels to the microprocessor module, the two sets of current sampling modules, the two sets of voltage sampling modules, the CAN communication module, and the PWM module.

The host computer generates control information based on an input signal, and transmits the control information to the microprocessor module through the CAN communication module for feedback control.

The PWM module provides a PWM signal to the inverter circuit or the DC/DC converter of the WPT system.

The microprocessor module is a digital signal processor (DSP), an asynchronous response mode (ARM) processor, or a field programmable gate array (FPGA).

The current sampling module and the voltage sampling module acquire a circuit current and a circuit voltage on the primary side or the secondary side from the WPT system, and transmit the circuit current and the circuit voltage to the microprocessor module. The microprocessor module measures the circuit current and the circuit voltage, and generates a chip select signal PWMEN. After a protection signal output by the current sampling module is processed by a signal isolation circuit and is input to the logic conversion circuit together with the chip select signal PWMEN, the logic conversion circuit outputs a PWM enable signal. The PWM enable signal is transmitted to the PWM module, and the PWM module determines, based on the PWM enable signal, whether to generate a PWM signal and transmit it to the inverter circuit or the DC/DC converter to control the power supply or charging on the primary side or the secondary side. The microprocessor module transmits the circuit current and the circuit voltage to the CAN communication module, and the CAN communication module then transmits the circuit current and the circuit voltage to the host computer for display.

The current sampling module includes a voltage comparison circuit, a first second-order active filter circuit, a first voltage conversion circuit, and a connector. An output pin of the connector is connected in parallel with a capacitor C11, the first voltage conversion circuit, the voltage comparison circuit, and the first second-order active filter circuit, where the capacitor C11 is grounded, the voltage comparison circuit outputs a protection signal, and the first second-order active filter circuit outputs a circuit current. The first voltage conversion circuit includes a resistor R10, a resistor R11, a resistor R14, and a resistor R15, where the resistor R10, the resistor R11, the resistor R14, and the resistor R15 each have one terminal connected to the output pin of the connector, and the other terminal grounded. In the voltage comparison circuit, one terminal of a resistor R6 is connected to the output pin of the connector, and the other terminal of the resistor R6 is separately connected to a non-inverting input terminal of a comparator U1A and an inverting input terminal of a comparator U1B. One terminal of a resistor R1 is connected to a −15 V power supply, the other terminal of the resistor R1 is separately connected to a resistor R2 and a capacitor C2 which are connected in parallel, and then grounded, the other terminal of the resistor R1 is connected to a capacitor C3 and then connected to the non-inverting input terminal of the comparator U1A, and the other terminal of the resistor R1 is connected to an inverting input terminal of the comparator U1A. One terminal of a resistor R9 is connected to a +15 V power supply, the other terminal of the resistor R9 is connected to a resistor R8 and a capacitor C6 which are connected in parallel, and then grounded, the other terminal of the resistor R9 is connected to a capacitor C7 and then connected to the inverting input terminal of the comparator U1B, and the other terminal of the resistor R9 is connected to a non-inverting input terminal of the comparator U1B. One terminal of a resistor R5 is connected to a +15 V power supply, and the other terminal is connected to a capacitor C5 and then grounded. An output terminal of the comparator U1A and an output terminal of the comparator U1B are connected, and then connected to the terminal of the resistor R5 connected to the capacitor CS to output a protection signal. In the first second-order active filter circuit, the output pin of the connector is connected to a non-inverting input terminal of an amplifier U2A through a resistor R12 and a resistor R13, the output pin of the connector is connected to an output terminal of the amplifier U2A through the resistor R12 and a capacitor C8, the output pin of the connector is grounded separately through a resistor R16 and a capacitor C12, a terminal of the resistor R13 connected to the non-inverting input terminal of the amplifier U2A is connected to a capacitor C13 and then grounded, an inverting input terminal of the amplifier U2A is connected to an output terminal of the amplifier U2A, and the output terminal of the amplifier U2A outputs a circuit current.

The logic conversion circuit includes a NAND gate logic chip U3 and an OR gate logic chip U4, a +3.3 V power supply is grounded separately through the capacitor C9 and the NAND gate logic chip U3, input terminals of the NAND gate logic chip U3 separately input protection signals output by the two sets of current sampling modules and processed by the respective signal isolation circuits, an output terminal of the NAND gate logic chip U3 is connected to one input terminal of the OR gate logic chip U4, the +3.3 V power supply is grounded separately through the capacitor C10 and the OR gate logic chip U4, a chip select signal PWMEN is connected to the resistor R18 through the +3.3 V power supply and then connected to the other input terminal of the OR gate logic chip U4, and an output terminal of the OR gate logic chip U4 is connected to the resistor R17 through the +3.3 V power supply and outputs a PWM enable signal.

The voltage sampling module includes a second second-order active filter circuit, a second voltage conversion circuit, a step-down circuit, and a mutual inductor US. The step-down circuit includes resistors R19 to R23 connected in series, one terminal of the step-down circuit is connected to the inverter circuit or a positive electrode C+ of the DC/DC converter in the WPT system, the other terminal of the step-down circuit is connected to a +HT pin of the mutual inductor U5, a −HT pin of the mutual inductor U5 is connected to the inverter circuit or a negative electrode C− of the DC/DC converter in the WPT system, M pins of the mutual inductor U5 are grounded through a capacitor C16, a resistor R24, and a resistor R27 in the second voltage conversion circuit respectively, and a lead wire between the resistor R24 and the resistor R27 is connected to the second second-order active filter circuit. In the second second-order active filter circuit, the lead wires between the resistor R24 and the resistor R27 are grounded through a resistor R28 and a capacitor C15 respectively, and then connected to a non-inverting input terminal of an amplifier U2B through a resistor R25 and a resistor R26, a capacitor C14 is connected between the resistor R25 and an output terminal of the amplifier U2B, a terminal of the resistor R26 connected to the non-inverting input terminal of the amplifier U2B is connected to a capacitor C17 and then grounded, an inverting input terminal of the amplifier U2B is connected to the output terminal of the amplifier U2B, and the output terminal of the amplifier U2B outputs a circuit voltage. The resistors in the step-down circuit are high-power precision alloy resistors.

In the WPT system, the transmitter coils on the primary side are laid on the road at intervals along a vehicle driving direction, the receiver coils on the secondary side are disposed on the chassis of the electric vehicle, and the transmitter coil and the receiver coil each include a double rectangular coil, a ferrite core surface, and a shielding aluminum plate that are stacked in sequence from top to bottom, and the double rectangular coil includes an upper rectangular coil and a lower rectangular coil arranged without space on the ferrite core surface in a direction perpendicular to the vehicle driving direction.

In the WPT system, the magnetic coupling system for segmented dynamic wireless charging composed of a transmitter coil on the primary side and a receiver coil on the secondary side includes a segmented dynamic wireless charging system transmitter and a dynamic wireless charging system receiver, where the segmented dynamic wireless charging system transmitter includes several transmitter coils that are spaced apart on the road along the vehicle driving direction, and the dynamic wireless charging system receiver includes receiver coils disposed on the chassis of the electric vehicle.

The upper rectangular coil and the lower rectangular coil are spirally wound from outside to inside in opposite directions.

The upper rectangular coil and the lower rectangular coil in the transmitter coil and the receiver coil are of the same size and shape, and a length $l_p$ and a width $w_p$ of the upper rectangular coil in the transmitter coil satisfies $l_p=w_p$; a length $l_a$ of the ferrite core surface satisfies $l_a>l_p$, a width $w_a$ of the ferrite core surface satisfies $w_a>2*w_p$, a length $l_b$ of the shielding aluminum plate satisfies $l_b>l_a$, and a width $w_b$ of the shielding aluminum plate satisfies $w_b>w_a$; and a length $l_s$ of the upper rectangular coil in the receiver coil satisfies $l_s=1.8l_p$, and a width $w_s$ of the upper rectangular coil in the receiver coil satisfies $w_s=w_p$.

A distance $d_p$ between adjacent transmitter coils satisfies $d_p=0.5l_b$.

A length of the transmitter coil and a length of the receiver coil are both parallel to the vehicle driving direction.

The ferrite core surface includes several closely arranged ferrite cores.

The ferrite core surface and the shielding aluminum plate are connected by thermal conductive silica gel.

A transmission distance between the segmented dynamic wireless charging system transmitter and the dynamic wireless charging system receiver ranges from 150 mm to 250 mm.

The present disclosure has the following beneficial effects:

The present disclosure designs a controller circuit for the WPT system, to use a mutual inductor and a Hall effect sensor to collect voltage and current signals respectively, implementing electric isolation of strong and weak currents, reducing impact of high-frequency noise in a main circuit on detection signals, and achieving stable performance. With a simple composition, the controller circuit can be deployed on the circuit board and is especially suitable for mass production, and provides hardware/software double protection against over current and over voltage.

The magnetic coupling system for segmented dynamic wireless charging in the control system of the present disclosure can effectively reduce the change of the coupling coefficient by optimizing a distance between the transmitter coils and a size of the receiver coil, to obtain a relatively stable output power, thereby improving reliability of the system and achieving efficient power transfer. Moreover, to reduce the impact of the magnetic field emitted by the system on the surrounding space environment, a shielding aluminum plate and a ferrite core surface are added to shield the magnetic field, effectively reducing electromagnetic leakage.

Figure 1:
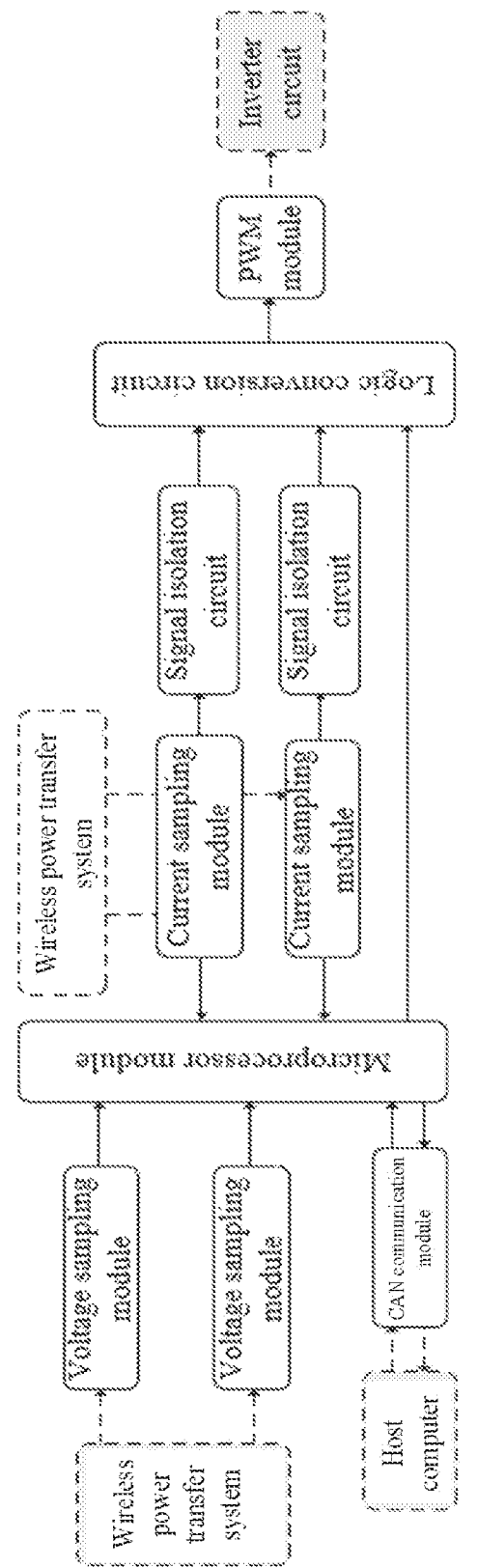
FIG. 1 is a principle diagram of a control system.

In the FIGS. 1. voltage comparison circuit, 2. first second-order active filter circuit, 3. first voltage conversion circuit, 4. connector, 5. second voltage conversion circuit, 6. step-down circuit, 7. second second-order active filter circuit, 8. logic conversion circuit; transmitter coil 101, double rectangular coil 102, upper rectangular coil 103, lower rectangular coil 104, ferrite core surface 105, shielding aluminum plate 106, and receiver coil 107.

DETAILED DESCRIPTION OF THE EMBODIMENTS

The present disclosure is further described below with reference to the accompanying drawings and examples.

As shown in FIG. 1, a control system of the present disclosure includes a circuit board, and a microprocessor module, two sets of current sampling modules, two sets of voltage sampling modules, a CAN communication module, and a PWM module that are disposed on the circuit board. The two sets of current sampling modules, the two sets of voltage sampling modules, a logic conversion circuit, and the CAN communication module are all connected to the microprocessor module through circuit board wiring; the two sets of current sampling modules are connected to the logic conversion circuit through their respective signal isolation circuits, the logic conversion circuit is connected to the PWM module, the PWM module is connected to an inverter circuit or a DC/DC converter, and the current sampling modules and the voltage sampling modules are connected to a primary side or a secondary side of the WPT system.

Figure 2:
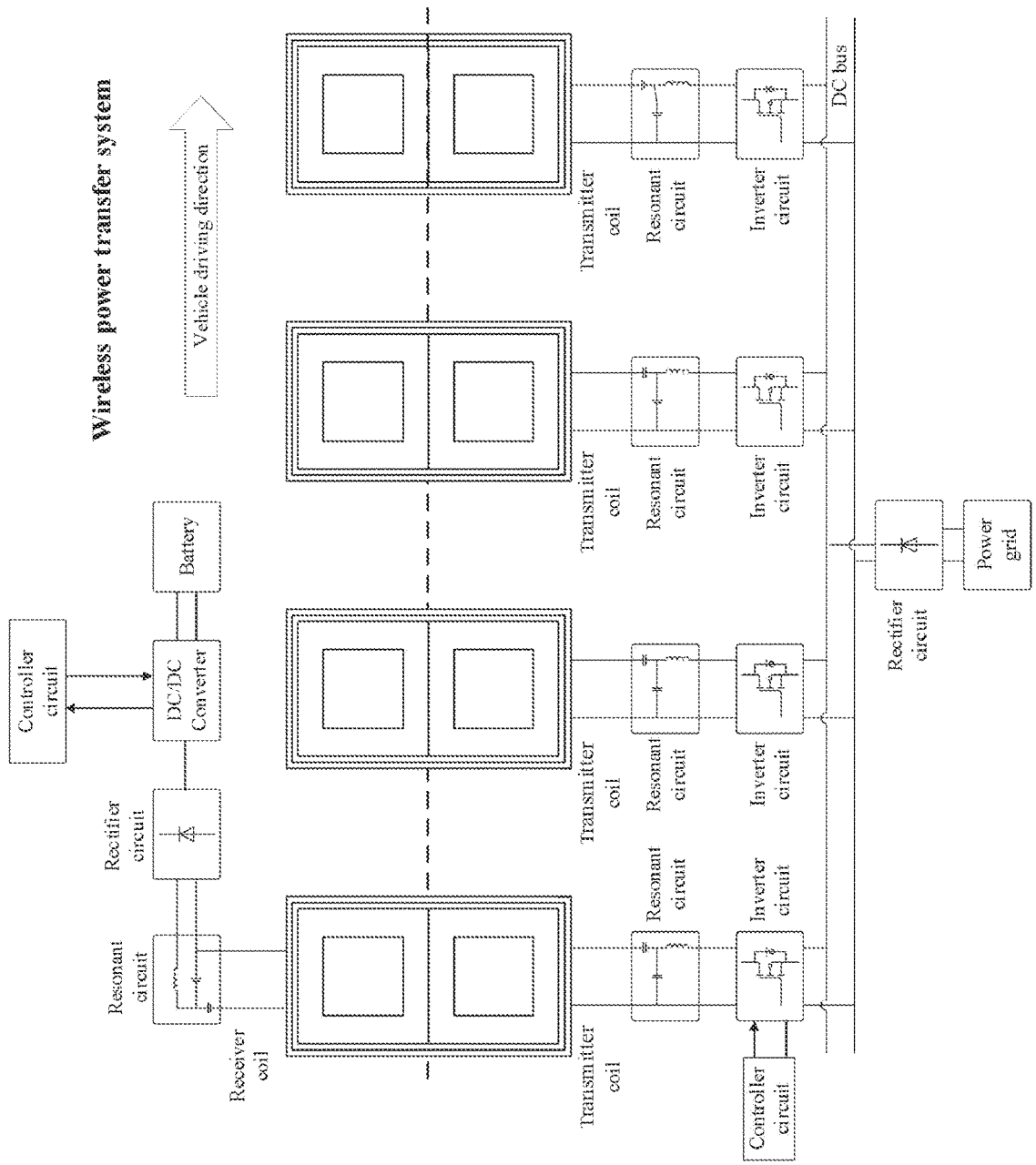
FIG. 2 is an application diagram of a controller circuit in a WPT system.

As shown in FIG. 2, the WPT system includes a primary side and a secondary side. The primary side includes a transmitter coil, a primary-side resonant circuit, an inverter circuit, a rectifier circuit, and a power grid that are sequentially connected, and the secondary side includes a receiver coil, a secondary-side resonant circuit, a rectifier circuit, a DC/DC converter, and a battery that are sequentially connected.

The primary side and the secondary side of the WPT system are each provided with a controller circuit, a current sampling module and a voltage sampling module in the controller circuit on the primary side are connected to the inverter circuit, and a current sampling module and a voltage sampling module in the controller circuit on the secondary side are connected to the DC/DC converter.

The controller circuit further includes a switch mode power supply module, where the switch mode power supply module supplies working power of corresponding voltage levels to a microprocessor module, the two sets of current sampling modules, the two sets of voltage sampling modules, a CAN communication module, and a PWM module.

The current sampling module and the voltage sampling module acquire a circuit current and a circuit voltage on the primary side or the secondary side from the WPT system, and transmit the circuit current and the circuit voltage to the microprocessor module. The microprocessor module measures the circuit current and the circuit: voltage, and generates a chip select signal PWMEN. After a protection signal output by the current sampling module is processed by a signal isolation circuit and is input to the logic conversion circuit 8 together with the chip select signal PWMEN, the logic conversion circuit 8 outputs a PWM enable signal. The PWM enable signal is transmitted to the PWM module, and the PWM module determines, based on the PWM enable signal, whether to generate a PWM signal and transmit it to the inverter circuit or the DC/DC converter to control the power supply or charging on the primary side or the secondary side. The microprocessor module transmits the circuit current and the circuit voltage to the CAN communication module, and the CAN communication module then transmits the circuit current and the circuit voltage to a host computer for display. The host computer generates control information based on an input signal, and transmits the control information to the microprocessor module through the CAN communication module for feedback control. Through the CAN communication module, data is exchanged between the controller and the host computer. On the one hand, the controller transmits the collected current and voltage signals and a work mode status of the controller to the host computer through the CAN communication module for display; on the other hand, the host computer can transmit a control command to the controller to adjust a work mode of the system.

The PWM module provides a PWM signal of 80 kHz to 100 kHz to the inverter circuit or DC/DC converter of the WPT system, to drive the inverter circuit or the DC/DC converter to generate a high-frequency voltage signal of a corresponding frequency. The microprocessor module is a DSP, an ARM processor, or an FPGA, and can respond quickly based on the current and voltage signals.

When the microprocessor module determines that the collected circuit current and circuit voltage are greater than a preset current threshold or voltage threshold, the microprocessor module adopts a protection mechanism, outputs a high-level chip select signal PWMEN, and transmits it to the logic conversion circuit 8, so that the logic conversion circuit 8 outputs a high-level PWM enable signal, and transmits the high-level PWM enable signal to the PWM module to turn off the PWM module, and the PWM module does not control the inverter circuit or the DC/DC converter to work, thereby protecting the WPT system through software.

When the voltage signals collected in the two sets of current sampling modules exceed the preset upper or lower voltage thresholds, the protection signal is at low level. When at least one of the output protection signals is at low level, the protection signal is transmitted to the logic conversion circuit 8, such that the logic conversion circuit 8 outputs a high-level PWM enable signal, and transmits the high-level PWM enable signal to the PWM module to turn off the PWM module, and the PWM module does not control the inverter circuit or the DC/DC converter to work, thereby protecting the WPT system through hardware.

Figure 3:
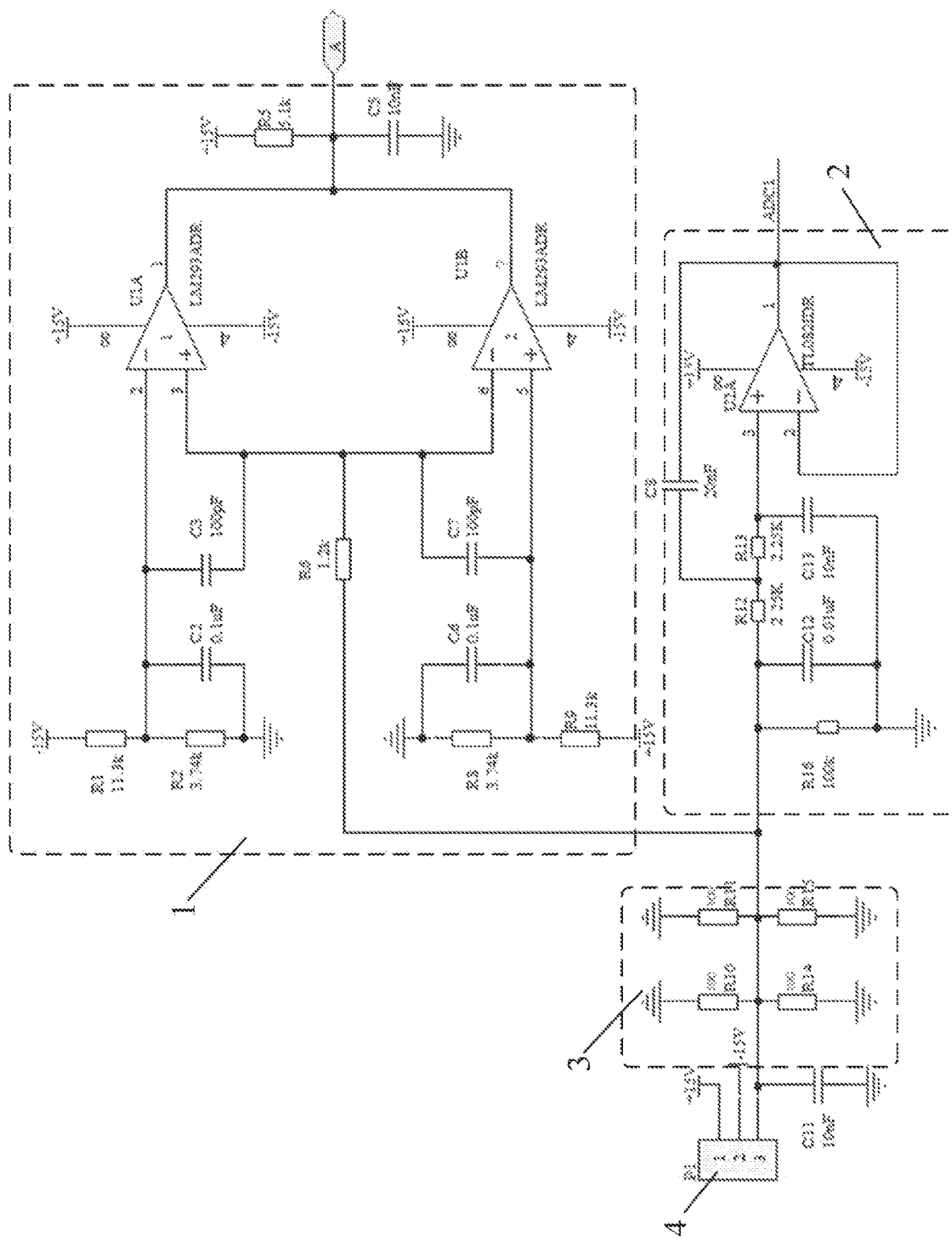
FIG. 3 is a principle diagram of a current sampling module.

As shown in FIG. 3, a current sampling module includes a voltage comparison circuit 1, a first second-order active filter circuit 2, a first voltage conversion circuit 3, and a connector 4. An output pin of the connector 4 is connected in parallel with a capacitor C11, the first voltage conversion circuit 3, the voltage comparison circuit I, and the first second-order active filter circuit 2, where the capacitor C11 is grounded, the voltage comparison circuit 1 outputs a protection signal, and the first second-order active filter circuit 2 outputs a circuit current. The first voltage conversion circuit 3 includes a resistor R10, a resistor R11, a resistor R14, and a resistor R15, where the resistor R10, the resistor R11, the resistor R14, and the resistor R15 each have one terminal connected to the output pin of the connector 4, and the other terminal grounded. In the voltage comparison circuit 1, one terminal of a resistor R6 is connected to the output pin of the connector 4, and the other terminal of the resistor R6 is separately connected to a non-inverting input terminal of a comparator U1A and an inverting input terminal of a comparator U1B. One terminal of a resistor R1 is connected to a −15 V power supply, the other terminal of the resistor R1 is separately connected to a resistor R2 and a capacitor C2 which are connected in parallel, and then grounded, the other terminal of the resistor R1 is connected to a capacitor C3 and then connected to the non-inverting input terminal of the comparator U1A, and the other terminal of the resistor R1 is connected to an inverting input terminal of the comparator U1A. One terminal of a resistor R9 is connected to a +15 V power supply, the other terminal of the resistor R9 is connected to a resistor R8 and a capacitor C6 which are connected in parallel, and then grounded, the other terminal of the resistor R9 is connected to a capacitor C7 and then connected to the inverting input terminal of the comparator U1B, and the other terminal of the resistor R9 is connected to a non-inverting input terminal of the comparator U1B. One terminal of a resistor R5 is connected to a +15 V power supply, and the other terminal is connected to a capacitor C5 and then grounded. An output terminal of the comparator U1A and an output terminal of the comparator U1B are connected, and then connected to the terminal of the resistor R5 connected to the capacitor C5 to output a protection signal. In the first second-order active filter circuit 2, the output pin of the connector 4 is connected to a non-inverting input terminal of an amplifier U2A through a resistor R12 and a resistor R13, the output pin of the connector 4 is connected to an output terminal of the amplifier U2A through the resistor R12 and a capacitor C8, the output pin of the connector 4 is grounded separately through a resistor R16 and a capacitor C12, a terminal of the resistor R13 connected to the non-inverting input terminal of the amplifier U2A is connected to a capacitor C13 and then grounded, an inverting input terminal of the amplifier U2A is connected to an output terminal of the amplifier U2A, and the output terminal of the amplifier U2A outputs a circuit current.

Each set of current sampling modules includes a voltage comparison circuit 1, a first second-order active filter circuit 2, a first voltage conversion circuit 3, and a connector 4; the first voltage conversion circuit 3 in each set is connected to a corresponding signal isolation circuit 7, and output terminals of the two sets of signal isolation circuits 7 are connected to the logic conversion circuit 8 to form a current sampling hardware protection mechanism. In each set of current sampling modules, a Hall effect sensor is connected to the connector, a large current to be collected is converted into a small current which is converted into a voltage signal through the voltage conversion circuit 3, and the first second-order active filter circuit 2 transmits the voltage signal to the microprocessor module for collection of a current signal; and the voltage signal converted by the first voltage conversion circuit 3 is transmitted to the voltage comparison circuit 1, and when the voltage signal exceeds a preset upper or lower voltage threshold, a low level is transmitted for the protection signal.

In this embodiment, the voltage comparison circuit 1 includes an LM293ADRchip, a resistor, and a capacitor, and the upper and lower voltage thresholds are set by parameters of R1, R2, R8, and R9, In this example, the microprocessor adopts a TMS320DSP28335chip, and a maximum voltage allowed by an analog-to-digital converter (ADC) interface of this processor does not exceed 3.3 V in principle. To protect the ADC interface, R1 and R2, and RS and R9 share −15 V and +15 V voltages respectively, and a threshold range specified by the comparison circuit is from −3.74 V to +3.74 V.

Figure 4:
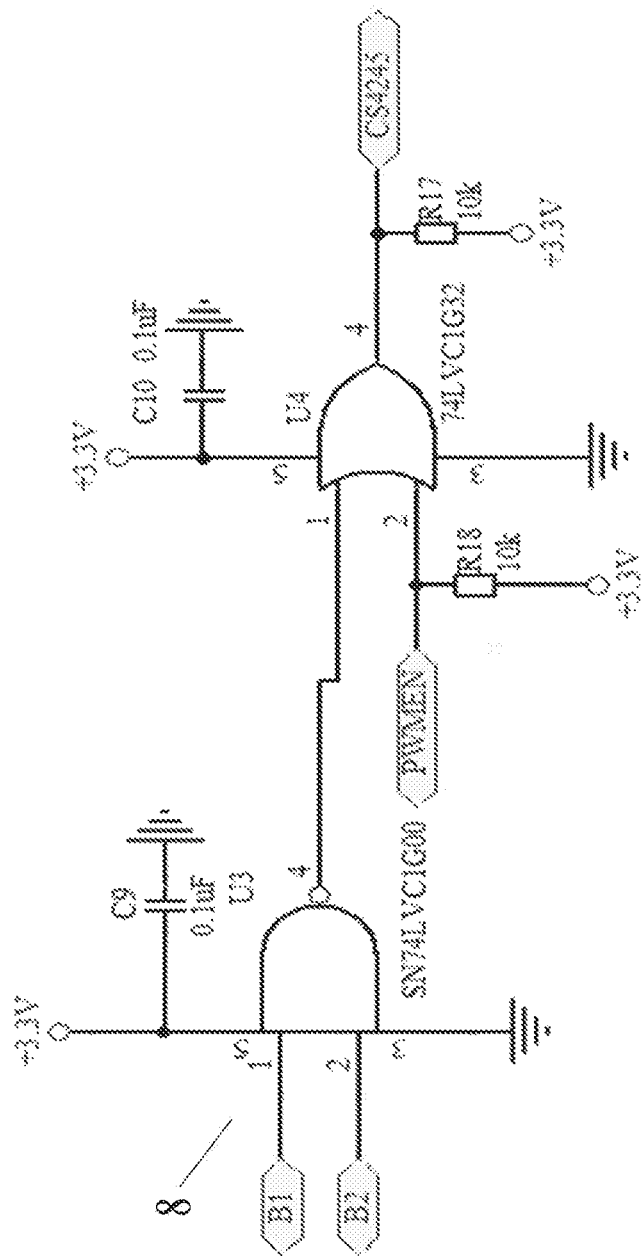
FIG. 4 is a principle diagram of a logic conversion circuit.

As shown in FIG. 4, the logic conversion circuit 8 includes a NAND gate logic chip U3 and an OR gate logic chip U4, a +3.3 V power supply is grounded separately through the capacitor C9 and the NAND gate logic chip 113, input terminals of the NAND gate logic chip U3 separately input protection signals output by the two sets of current sampling modules and processed by the respective signal isolation circuits, an output terminal of the NAND gate logic chip U3 is connected to one input terminal of the OR gate logic chip U4, a +3.3 V power supply is grounded separately through a capacitor C10 and the OR gate logic chip U4, a chip select signal PWMEN is connected to a resistor R18 connected to a +3.3 V power supply, and then is connected to the other input terminal of the OR gate logic chip U4, and an output terminal of the OR gate logic chip 114 is connected to a resistor R17 connected to a +3.3 V power supply, and then outputs a PWM enable signal.

When the two sets of current sampling modules work properly, corresponding comparison circuit outputs B1 and B2 are both logic high, and the NAND gate logic chip U3-74LVC1G00 generates a low level. During normal operation, a chip select signal PWMEN generated by the microprocessor module is a low level, a PWM enable signal generated by the OR gate logic chip U4-74LVC1G32 is a low level, and the PWM module is driven. When the two sets of current sampling modules encounter overcurrent, corresponding comparison circuit outputs B1 and B2 are logic low, and the NAND gate logic chip U3-74LVC1G00 generates a high level. A chip select signal PWMEN generated by the microprocessor module is a low level, a PWM enable signal generated by the OR gate logic chip U4-74LVC1G32 is a high level, and the PWM module is turned off. Therefore, when any comparison circuit in the two sets of current sampling modules detects that a sampling voltage exceeds a threshold range, a generated protection signal is a low level, and a PWM enable signal is disabled.

Moreover, the microprocessor module can set a sampling voltage and current protection mechanism through software. When sampled voltage and current are greater than corresponding specified thresholds, the microprocessor module activates the protection mechanism, such that a chip select signal PWMEN is a high level, thereby disabling a PWM enable signal.

Figure 5:
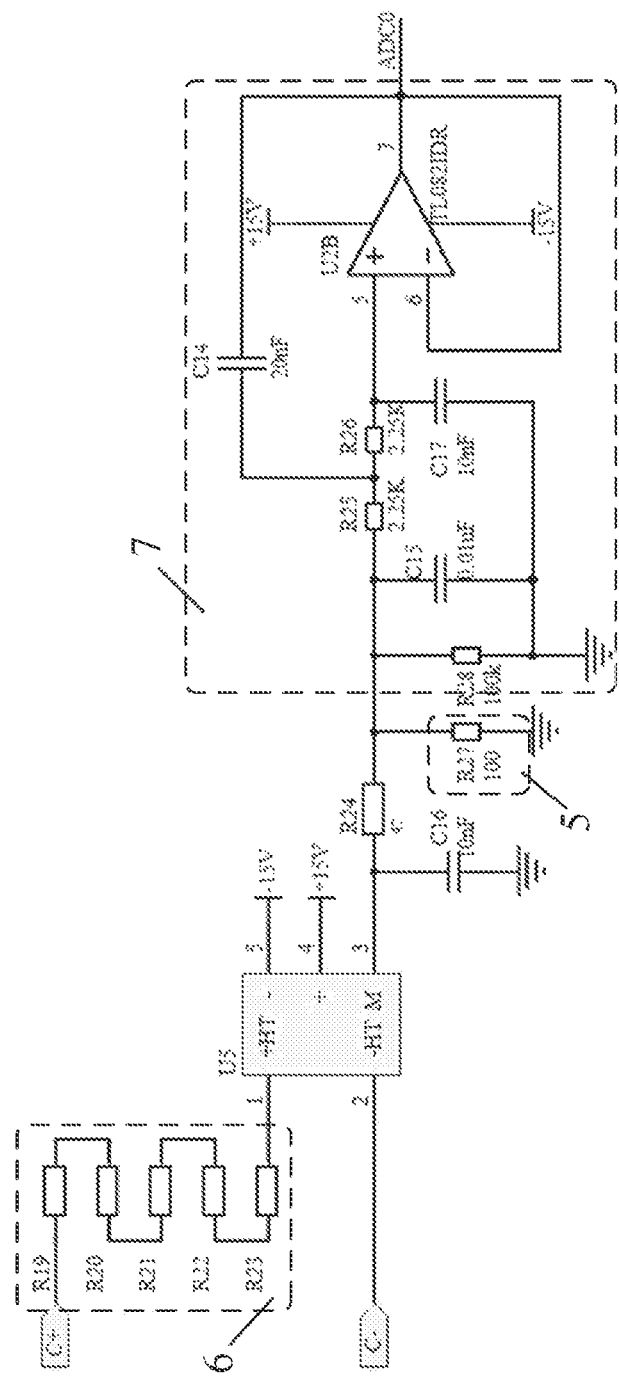
FIG. 5 is a principle diagram of a voltage sampling module.

As shown in FIG. 5, the voltage sampling module includes a second second-order active filter circuit 7, a second voltage conversion circuit 5, a step-down circuit 6, and a mutual inductor US. The step-down circuit 6 includes resistors R19 to R23 connected in series, one terminal of the step-down circuit 6 is connected to the inverter circuit or a positive electrode C+ of the DC/DC converter in the WPT system, the other terminal of the step-down circuit 6 is connected to a +HT pin of the mutual inductor U5, a −HT pin of the mutual inductor U5 is connected to the inverter circuit or a negative electrode C− of the DC/DC converter in the WPT system, an M pin of the mutual inductor U5 is grounded through a capacitor C16, and is grounded separately through a resistor R24 and a resistor R27 in the second voltage conversion circuit 5, and a wire between the resistor R24 and the resistor R27 is led out to the second second-order active filter circuit 7. In the second second-order active filter circuit 7, the wire led out from the resistor R24 and the resistor R27 is separately grounded through a resistor R28 and a capacitor C15, and is connected to a non-inverting input terminal of an amplifier U2B through a resistor R25 and a resistor 126, a capacitor C14 is connected between the resistor R25 and an output terminal of the amplifier U2B, a terminal of the resistor R26 connected to the non-inverting input terminal of the amplifier U2B is connected to a capacitor C17 and then grounded, an inverting input terminal of the amplifier U2B is connected to the output terminal of the amplifier U2B, and the output terminal of the amplifier U2B outputs a circuit voltage. The resistors in the step-down circuit 6 are high-power precision alloy resistors.

In each set of voltage sampling circuits, a collected voltage is converted into a small current by the step-down circuit 6, the current is isolated and converted by the mutual inductor U5, converted into a voltage by the second voltage conversion circuit 5, and then transmitted to the microprocessor module through the second second-order active circuit 7, for collection of the voltage signal.

In this example, a LENT LV-25P sensor is used as a main device for voltage sampling. The LV-25P sensor has closed-loop magnetic flux compensation, can measure a maximum voltage of 600 V, and can meet the requirements of this design in terms of accuracy, response speed, and bandwidth.

In FIG. 5, $R_{19}$, $R_{21}$, $R_{22}$, $R_{23}$, and $R_{24}$ are five step-down resistors connected in series on a primary side of the Hall effect sensor. These resistors are 2W precision alloy resistors, and sequentially connected in series according to their electrical properties, with a total resistance of 55 kΩ. Assuming that a sampling voltage is $U_{s1}$, a current $I_{s1}$, of the primary side of the Hall effect sensor is:

$$I_{s1} = \frac{U_{s1}}{R_1 + R_2 + R_3 + R_4 + R_5} = \frac{U_{s1}}{55 k\Omega}$$

According to a turn ratio of the mutual inductor, a current $I_{s2}$ of a secondary side of the Hall effect sensor can be obtained:

$$I_{s2} = 2.5 \times I_{s1}$$

A current signal on the secondary side of the Hall effect sensor is converted into a secondary side sampling voltage $U_{s2}$ through the voltage conversion resistor R27 on the secondary side:

$$U_{s2} = I_{s2} \times R_{27} = 100 \times I_{s2}$$

The sampling voltage $U_{s2}$ on the secondary side is transmitted to an ADC module of the DSP28335 through the second second-order active filter circuit 7, and then converted into a digital signal, and an obtained digital value is:

$$U_{DIGITAL1} = \frac{U_{s2}}{3} \times 4095$$

That is, the circuit voltage collected by the voltage sampling module is:

$$U_{DIGITAL A} \approx 6.2 \times U_{s1}$$

As shown in FIG. 3, the current sampling module in this example is a CHB-50SF Hall effect sensor with a turn ratio of 1000:1. In this example, the first voltage conversion circuit 3 uses four 100 Ω resistors connected in parallel, to increase the resistor power. A current sampling signal is converted into a voltage signal through the sampling resistor, and a sampling voltage $U_{s3}$ is:

$$U_{s3} = I_{s3} \times \frac{390\Omega}{4 \times 1000} = 0.0975 \times I_{s3}$$

Then the voltage signal is transmitted to an ADC unit of a DSP through an operational amplifier circuit, and is converted into a digital signal:

$$U_{DIGITAL2} = \frac{U_{s3}}{3} \times 4095 = 133.0875 \times I_{S3}$$

Because the circuit voltage is known, the circuit current collected by the current sampling module can be obtained according to the foregoing formula. In the microprocessor, the actual sampling voltage and current values can be obtained through software design.

In this embodiment, LabVIEW is used to design a display interface of the host computer, and information is exchanged between the host computer and the microprocessor through the CAN communication module. The LabVIEW interface can display values of the collected current and voltage signals. A control algorithm can be programmed into the TMS320DSP28335 microprocessor. Through the LabVIEW host computer, parameters of the control algorithm in the microprocessor can be modified in real time, to adjust application effects of the control algorithm. The host computer can also send a PWM frequency signal to the microprocessor to adjust a frequency of a PWM signal. In this embodiment, the frequency of the PWM signal is set to 85 kHz.

In a specific embodiment, a magnetic coupling system for segmented dynamic wireless charging includes a segmented dynamic wireless charging system transmitter and a dynamic wireless charging system receiver, both of which transmits power in a manner of magnetic coupling. The segmented dynamic wireless charging system transmitter includes several transmitter coils 101 that are spaced apart on the road along a vehicle driving direction, and the dynamic wireless charging system receiver includes receiver coils 107 disposed on a chassis of an electric vehicle. The transmitter coil 101 and the receiver coil 107 each include a double rectangular coil 102, a ferrite core surface 105, and a shielding aluminum plate 106 that are stacked in sequence from top to bottom, and the double rectangular coil 102 includes an upper rectangular coil 103 and a lower rectangular coil 104 arranged without space on the ferrite core surface 105 in a direction perpendicular to the vehicle driving direction. A transmission distance between the segmented dynamic wireless charging system transmitter and the dynamic wireless charging system receiver ranges from 150 mm to 250 mm.

Figure 7:
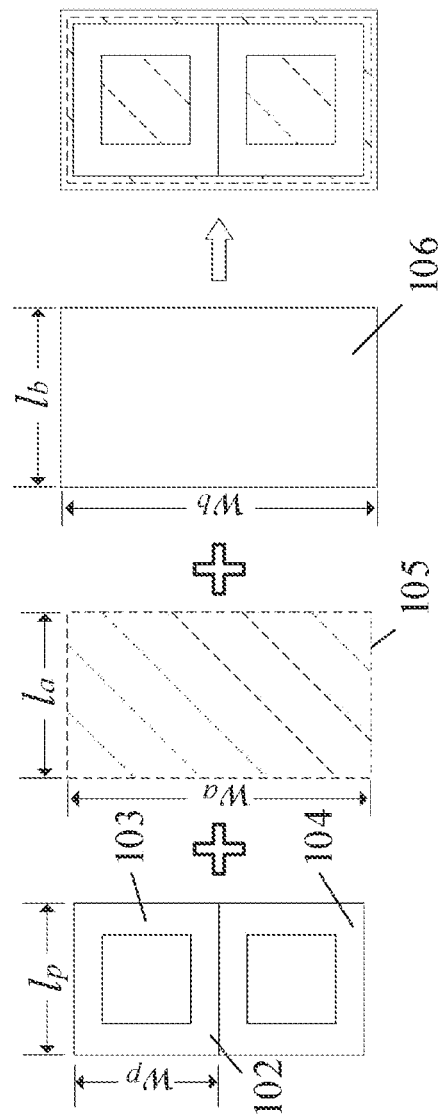
FIG. 7 is a structural diagram of a transmitter coil and a receiver coil.
Figure 8:
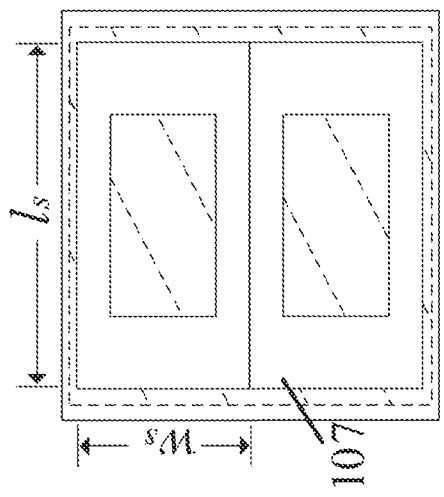
FIG. 8 shows a segmented dynamic wireless charging system receiver according to the present disclosure.

As shown in FIG. 7 and FIG. 8, the upper rectangular coils 103 and the lower rectangular coils 104 in the transmitter coil 101 and the receiver coil 107 are of the same size and shape, and a length $l_p$ and a width $w_p$ of the upper rectangular coil 103 in the transmitter coil 101 satisfies $l_p=w_p$; a length $l_a$ of the ferrite core surface 105 satisfies $l_a>l_p$, a width $w_a$ of the ferrite core surface 105 satisfies $w_a>2*w_p$, a length $l_b$ of the shielding aluminum plate 106 satisfies $l_b>l_a$, and a width $w_b$ of the shielding aluminum plate 106 satisfies $w_b>w_a$; and a length $l_s$ of the upper rectangular coil 103 in the receiver coil 107 satisfies $l_s=1.8l_p$, and a width $w_s$ of the upper rectangular coil 103 in the receiver coil 107 satisfies $w_s=w_p$. The upper rectangular coil 103 and the lower rectangular coil 104 are spirally wound from outside to inside in opposite directions. The upper rectangular coil 103 and the lower rectangular coil 104 both are multi-strand Litz wires. A distance $d_p$ between adjacent transmitter coils 101 satisfies $d_p=0.5l_p$. A length of the transmitter coil 101 and a length of the receiver coil 107 are both parallel to the vehicle driving direction.

The ferrite core surface 105 includes several closely arranged ferrite cores. The ferrite core surface 105 and the shielding aluminum plate 106 are connected by thermal conductive silica gel.

In this embodiment of the present disclosure, an excitation current in the transmitter coil 101 and the receiver coil 107 is a high-frequency alternating current of 85 kHz. To reduce an eddy current loss caused by the skin effect and proximity effect, a Litz wire of 800 copper wires with a diameter of 0.1 mm is wound into a double rectangular coil 102. Due to site limitations, the length and width of the rectangular coils 3 and 4 in the transmitter coil 101 are set to $l_p=w_p=280$ mm; the length and width of the ferrite core surface are set to $l_a=290$ mm and $w_a=570$ mm, respectively; and the length and width of the shielding aluminum plate 106 are set to $l_b=300$ mm and $w_b=580$ mm, respectively. A distance between the transmitter coils is set to the distance between the transmitter coils 101 $d_p=150$ mm. The distance between the segmented dynamic wireless charging system transmitter and the dynamic wireless charging system receiver is 180 mm.

The ferrite core surface 105 is placed under the double rectangular coil 102. The ferrite core surface 105 has a high resistivity, and can reduce a magnetic resistance in a mutual inductance area and increase coupling between the transmitter coil and the receiver coil, thereby improving efficiency. The shielding aluminum plate 106 is placed under the ferrite cores. The shielding aluminum plate is a metal shielding plate with electrical conductivity. Eddy currents are generated inside the metal through the divergent alternating magnetic field, and the magnetic field generated by the eddy currents in turn cancels the magnetic field in the space, thereby shielding the magnetic field.

Figure 6:
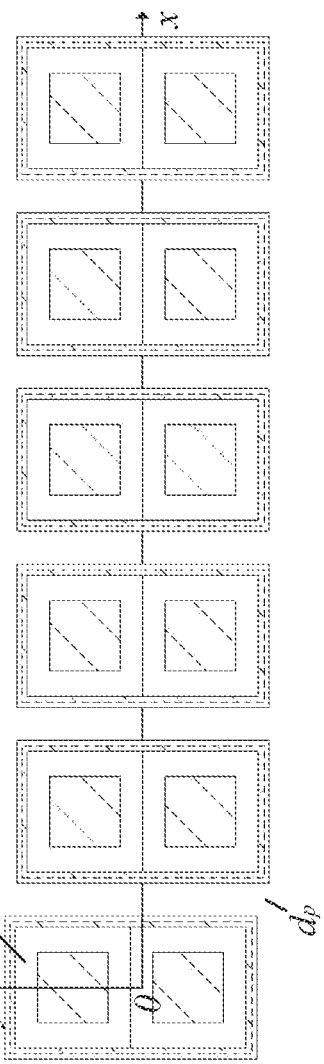
FIG. 6 shows a segmented dynamic wireless charging system transmitter according to the present disclosure.
Figure 9:
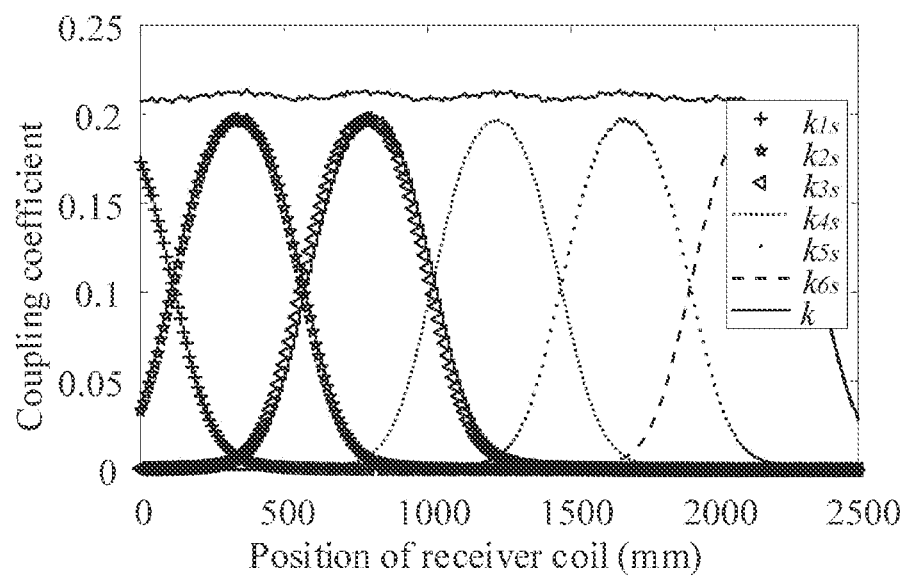
FIG. 9 shows a coupling coefficient between a receiver and a transmitter.

In this embodiment of the present disclosure, the segmented dynamic wireless charging system transmitter includes six transmitter coils 101. As shown in FIG. 6, the x-axis represents a vehicle driving direction, and the y-axis represents a direction perpendicular to the vehicle driving direction. In practical applications, a quantity of transmitter coils 101 is determined based on a length of the dynamic wireless charging road. When the electric vehicle is driving on the dynamic wireless charging road, to reduce a change range of a coupling coefficient between the segmented dynamic wireless charging system transmitter and the dynamic wireless charging system receiver, the length and width of the receiver coil 107 are set to $l_s$=50 mm and $w_s$=280 mm, respectively. FIG. 9 shows changes of the coupling coefficient after optimization. $k_{1s}$, $k_{2s}$, $k_{3s}$, $k_{4s}$, $k_{5s}$, and $k_{6s}$ represent coupling coefficients when the receiver coil 107 is coupled with six transmitter coils 101, respectively, and k represents a total coupling coefficient between the receiver coil and the segmented dynamic wireless charging system transmitter. As can be learned from FIG. 9, the total coupling coefficient is 0.21 on average, and a fluctuation rate of the coupling coefficient is 1.53%.

Figure 10:
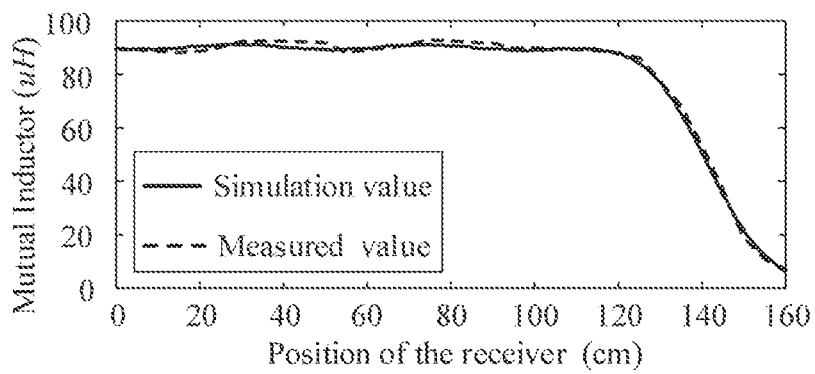
FIG. 10 is a comparison diagram of simulated and measured mutual inductance values of a magnetic coupling system.

FIG. 10 shows results obtained through simulation and actual measurement. It can be seen in FIG. 10 that the measured mutual inductor values of the magnetic coupling system are highly consistent with the simulated values, and a fluctuation rate of the mutual inductor values of the magnetic coupling system is 1.53%.

The foregoing simulation is performed in a dynamic wireless charging scenario based on the design of the present disclosure. A magnetic coupling system for segmented dynamic wireless charging that includes four transmitter coils 101 and one receiver coil 107 is established in Maxwell software based on specific dimensions of the transmitter coil 101 and the receiver coil 107, where a distance between the transmitter coil 101 and the receiver coil 107 is 180 mm.

The actual measurement is based on the design of the present disclosure. A magnetic coupling system for segmented dynamic wireless charging that includes four transmitter coils 101 and one receiver coil 107 is established based on specific dimensions of the transmitter coil 101 and the receiver coil 107. During the actual measurement, the receiver coil is disposed on a chassis of a wooden car, and the four transmitter coils 101 are placed in a moving direction of the wooden car, and movement of an electric vehicle is simulated through the movement of the wooden car. The chassis of the wooden car is 180 mm from the ground. The actual measurement is performed for a real magnetic coupling system in a dynamic wireless charging scenario.

Although the embodiments of the present disclosure have been illustrated and described, it should be understood that those of ordinary skill in the art may make various changes, modifications, replacements, and variations to the above embodiments without departing from the principle and spirit of the present disclosure, and the scope of the present disclosure is limited by the appended claims and their legal equivalents.

What is claimed is:

1. A control system for a wireless power transfer (WPT) system, wherein the control system comprises a circuit board, and a microprocessor module, two sets of current sampling modules, two sets of voltage sampling modules, a controller area network (CAN) communication module, and a pulse-width modulation (PWM) module that are disposed on the circuit board; the two sets of current sampling modules, the two sets of voltage sampling modules, a logic conversion circuit, and the CAN communication module are all connected to the microprocessor module through a circuit board wiring; the two sets of current sampling modules are connected to the logic conversion circuit through respective signal isolation circuits, the logic conversion circuit is connected to the PWM module, the PWM module is connected to an inverter circuit or a DC/DC converter, and the current sampling modules and the voltage sampling modules are connected to a primary side of the WPT system or a secondary side of the WPT system;

wherein the current sampling modules and the voltage sampling modules acquire a circuit current and a circuit voltage on the primary side or the secondary side from the WPT system, and transmit the circuit current and the circuit voltage on the primary side or the secondary side to the microprocessor module; the microprocessor module measures the circuit current and the circuit voltage on the primary side or the secondary side, and generates a chip select signal PWMEN; after a protection signal output by the current sampling modules is processed by the signal isolation circuit and the protection signal is input to the logic conversion circuit together with the chip select signal PWMEN, the logic conversion circuit outputs a PWM enable signal; the PWM enable signal is transmitted to the PWM module, and the PWM module determines, based on the PWM enable signal, whether to generate a PWM signal and transmit the PWM signal to the inverter circuit or the DC/DC converter to control a power supply or charging on the primary side or the secondary side; and the microprocessor module transmits the circuit current and the circuit voltage on the primary side or the secondary side to the CAN communication module, and the CAN communication module then transmits the circuit current and the circuit voltage on the primary side or the secondary side to a host computer for a display.

2. A power transfer system comprising the control system according to claim 1 and a WPT system, wherein the WPT system comprises the primary side and the secondary side; the primary side comprises a transmitter coil, a primary-side resonant circuit, the inverter circuit, a first rectifier circuit, and a power grid that are sequentially connected; and the secondary side comprises a receiver coil, a secondary-side resonant circuit, a second rectifier circuit, the DC/DC converter, and a battery that are sequentially connected; and the primary side and the secondary side of the WPT system are each provided with a controller circuit, the current sampling modules and the voltage sampling modules in the controller circuit on the primary side are connected to the inverter circuit, and the current sampling modules and the voltage sampling modules in the controller circuit on the secondary side are connected to the DC/DC converter.

3. The power transfer system according to claim 2, wherein the controller circuit further comprises a switch mode power supply module, and the switch mode power supply module supplies a working power of corresponding voltage levels to the microprocessor module, the two sets of current sampling modules, the two sets of voltage sampling modules, the CAN communication module, and the PWM module.

4. The control system for the WPT system according to claim 1, wherein each of the current sampling modules comprises a voltage comparison circuit, a first second-order active filter circuit, a first voltage conversion circuit, and a connector; an output pin of the connector is connected in parallel with a first capacitor, the first voltage conversion circuit, the voltage comparison circuit, and the first second-order active filter circuit, wherein the first capacitor is grounded, the voltage comparison circuit outputs the protection signal, and the first second-order active filter circuit outputs the circuit current; the first voltage conversion circuit comprises a first resistor, a second resistor, a third resistor, and a fourth resistor, wherein the first resistor, the second resistor, the third resistor, and the fourth resistor each comprise a first terminal connected to the output pin of the connector, and a second terminal grounded; in the voltage comparison circuit, a first terminal of a fifth resistor is connected to the output pin of the connector, and a second terminal of the fifth resistor is separately connected to a non-inverting input terminal of a first comparator and an inverting input terminal of a second comparator; a first terminal of a sixth resistor is connected to a −15 V power supply, a second terminal of the sixth resistor is separately connected to a seventh resistor and a second capacitor which are connected in parallel, and then grounded, the second terminal of the sixth resistor is connected to a third capacitor and then connected to the non-inverting input terminal of the first comparator, and the second terminal of the sixth resistor is connected to an inverting input terminal of the first comparator; a first terminal of an eighth resistor is connected to a +15 V power supply, a second terminal of the eighth resistor is separately connected to a ninth resistor and a fourth capacitor which are connected in parallel, and then grounded, the second terminal of the eighth resistor is connected to a fifth capacitor and then connected to the inverting input terminal of the second comparator, and the second terminal of the eighth resistor is connected to a non-inverting input terminal of the second comparator; a first terminal of a tenth resistor is connected to the +15 V power supply, and a second terminal of the tenth resistor is connected to a sixth capacitor and then grounded; an output terminal of the first comparator and an output terminal of the second comparator are connected, and then connected to the second terminal of the tenth resistor connected to the sixth capacitor to output the protection signal; in the first second-order active filter circuit, the output pin of the connector is connected to a non-inverting input terminal of an amplifier through an eleventh resistor and a twelfth resistor, the output pin of the connector is connected to an output terminal of the amplifier through the eleventh resistor and a seventh capacitor, the output pin of the connector is grounded separately through a thirteenth resistor and an eighth capacitor, a terminal of the twelfth resistor connected to the non-inverting input terminal of the amplifier is connected to a ninth capacitor and then grounded, an inverting input terminal of the amplifier is connected to the output terminal of the amplifier, and the output terminal of the amplifier outputs the circuit current.

5. The control system for the WPT system according to claim 1, wherein the logic conversion circuit comprises a NAND gate logic chip and an OR gate logic chip, a +3.3 V power supply is grounded separately through a first capacitor and the NAND gate logic chip, input terminals of the NAND gate logic chip separately input the protection signal output by the two sets of current sampling modules and processed by the respective signal isolation circuits, an output terminal of the NAND gate logic chip is connected to a first input terminal of the OR gate logic chip, the +3.3 V power supply is grounded separately through a second capacitor and the OR gate logic chip, the chip select signal PWMEN is connected to a first resistor connected to the +3.3 V power supply, and then is connected to the other a second input terminal of the OR gate logic chip, and an output terminal of the OR gate logic chip is connected to a second resistor connected to the +3.3 V power supply, and then outputs the PWM enable signal.

6. The control system for the WPT system according to claim 1, wherein each of the voltage sampling modules comprises a second second-order active filter circuit, a second voltage conversion circuit, a step-down circuit, and a mutual inductor; the step-down circuit comprises first to fifth resistors to connected in series, a first terminal of the step-down circuit is connected to the inverter circuit or a positive electrode of the DC/DC converter in the WPT system, a second terminal of the step-down circuit is connected to a +HT pin of the mutual inductor, a −HT pin of the mutual inductor is connected to the inverter circuit or a negative electrode of the DC/DC converter in the WPT system, an M pin of the mutual inductor is separately grounded through a first capacitor, a sixth resistor, and a seventh resistor in the second voltage conversion circuit, and a wire between the sixth resistor and the seventh resistor is led out to the second second-order active filter circuit; in the second second-order active filter circuit, the wire led out from the sixth resistor and the seventh resistor is separately grounded through an eighth resistor and a second capacitor, and is connected to a non-inverting input terminal of an amplifier through a ninth resistor and a tenth resistor, a third capacitor is connected between the ninth resistor and an output terminal of the amplifier, a terminal of the tenth resistor connected to the non-inverting input terminal of the amplifier is connected to a fourth capacitor and then grounded, an inverting input terminal of the amplifier is connected to the output terminal of the amplifier, and the output terminal of the amplifier outputs the circuit voltage.

7. A power transfer system comprising the control system according to claim 1 and a WPT system, wherein in the WPT system, transmitter coils on the primary side are laid on a road at intervals along a vehicle driving direction, a receiver coil on the secondary side is disposed on a chassis of an electric vehicle, and the transmitter coils and the receiver coil each comprise a double rectangular coil, a ferrite core surface, and a shielding aluminum plate that are stacked in sequence from top to bottom, and the double rectangular coil comprises an upper rectangular coil and a lower rectangular coil arranged without a space on the ferrite core surface in a direction perpendicular to the vehicle driving direction.

8. The control system for the WPT system according to claim 7, wherein the upper rectangular coil and the lower rectangular coil are spirally wound from outside to inside in opposite directions.

9. The control system for the WPT system according to claim 7, wherein the upper rectangular coil and the lower rectangular coil in each of the transmitter coils and the receiver coil are of a same size and shape, and a length $l_p$ and width $w_p$ of the upper rectangular coil in each of the transmitter coils satisfies $l_p=w_p$; a length $l_a$ of the ferrite core surface satisfies $l_a>l_p$, a width $w_a$ of the ferrite core surface satisfies $w_a>2*w_p$, a length $l_b$ of the shielding aluminum plate satisfies $l_b>l_a$, and a width $w_b$ of the shielding aluminum plate satisfies $w_b>w_a$; and a length $l_s$ of the upper rectangular coil in the receiver coil satisfies $l_s=1.8l_p$, and a width $w_s$ of the upper rectangular coil in the receiver coil satisfies $w_s=w_p$.

10. The control system for the WPT system according to claim 7, wherein a distance $d_p$ between adjacent transmitter coils satisfies $d_p=0.5l_b$.

* * * * *